United States Patent
Graham et al.

(10) Patent No.: US 10,877,230 B1
(45) Date of Patent: Dec. 29, 2020

(54) THERMAL CONTROL SYSTEM WITH SLIDING HEATSINK RESISTANCE CONTROL FOR PLUGGABLE OPTICS IN A HARDENED OPTICAL PLATFORM

(71) Applicant: Ciena Corporation, Hanover, MD (US)

(72) Inventors: Terence Graham, Manotick (CA); Bonnie Mack, Carp (CA); Mitchell O'Leary, Ottawa (CA); Trevor Meunier, Kemptville (CA); Eric Maniloff, Stittsville (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/656,732

(22) Filed: Oct. 18, 2019

(51) Int. Cl.
H05K 7/20 (2006.01)
G02B 6/42 (2006.01)
G02B 6/35 (2006.01)

(52) U.S. Cl.
CPC ......... *G02B 6/4269* (2013.01); *G02B 6/3576* (2013.01); *H05K 7/2049* (2013.01)

(58) Field of Classification Search
None
See application file for complete search history.

(56) References Cited

U.S. PATENT DOCUMENTS

| | | | | |
|---|---|---|---|---|
| 6,921,277 B2* | 7/2005 | Murr | ...................... | H01L 23/40 257/E23.083 |
| 8,333,598 B2* | 12/2012 | Mulfinger | ............ | H01R 12/737 439/67 |
| 10,401,581 B2* | 9/2019 | Gaal | .................... | G02B 6/4261 |
| 2019/0273340 A1* | 9/2019 | D'Inca | ................. | H01R 13/631 |

* cited by examiner

*Primary Examiner* — Rhonda S Peace
(74) *Attorney, Agent, or Firm* — Clements Bernard Walker; Lawrence A. Baratta, Jr.; Christopher L. Bernard

(57) ABSTRACT

A thermal control system for pluggable optics in an optical platform. The thermal control system includes a heatsink and an actuator. The heatsink is configured to dissipate heat from a pluggable optical module in the optical platform. The heatsink includes a mating surface configured to make thermal contact with a module surface of the pluggable optical module inserted into the optical platform. The actuator is configured to manipulate the mating surface to change a contact area between the mating surface and the module surface such that the contact area between the mating surface and the module surface is larger for a temperature above a predetermined temperature than for a temperature below a predetermined temperature.

20 Claims, 20 Drawing Sheets

THERMAL CONTROL SYSTEM WITH SLIDING HEATSINK RESISTANCE CONTROL FOR PLUGGABLE OPTICS IN A HARDENED OPTICAL PLATFORM

FIELD OF THE DISCLOSURE

The present disclosure generally relates to networking equipment. More particularly, the present disclosure relates to a hardened optical platform with pluggable optics and thermal management thereof.

BACKGROUND OF THE DISCLOSURE

An insatiable appetite for network resources, the growing number of Internet connections, ever-faster media streaming devices and the escalation of high-definition mobile video are together burdening already overtaxed cable networks. In the cable world, these applications require huge amounts of bandwidth coupled with low latency. What's more, the supporting infrastructure must offer the flexibility to cope with steadily increasing dynamic traffic flows. Accordingly, most cable operators are looking to a "Fiber Deep" architecture, which is an end-to-end solution combining packet switching and aggregation alongside coherent optical technology. In this case, Hybrid Fiber Coax (HFC) architectures are transformed and coexist with modern digital fiber and packet technologies. The term "Fiber Deep" has been used to describe an approach that empowers a forward-looking, universal access framework that includes Data Over Cable Service Interface Specification (DOCSIS), Remote PHY devices (RPD), point-to-point 10G, and higher fiber-based business services, variants of Passive Optical Network (xPON), small cells and finally Converged Haul 4G and 5G New Radio (NR) mobility futures.

As well, thermal management for high-speed optical networking equipment is a challenge. In a controlled environment, thermal management is achieved through air flow, vents in a chassis, fans, design choices, etc. For example, some work has focused on managing air flow to enable back-to-back shelf configurations, i.e., front or side airflow only, which is advantageous in Central Offices (CO), data centers, etc. However, these deployments are all in a controlled environment, e.g., air conditioning, no exposure to the environment, etc.

The use of pluggable optical modules is common in high-speed optical networking equipment deployed in a controlled environment. Numerous techniques for thermal management of pluggable optical modules exist, but they focus primarily on keeping the pluggable optical modules cool, such as by forced air flow driven by cooling fans over heatsinks. Outside plant equipment that is deployed in sealed housings (i.e., hardened) can operate in both high ambient temperature conditions and low ambient temperature conditions. With no air flow around the module, heat must be conducted to the housing by means of a heatsink, heat pipe, or vapor chamber. However, pluggable optical modules have a minimum operating case temperature, ranging from +20° C. at the high end through −5° C. for some modules and down to −20° C. for some high-performance modules, and thus, continued heat dissipation can result in case temperatures below the minimum in low ambient temperature conditions. Successful operation of a pluggable optical module in a poorly controlled or uncontrolled environment therefore requires both increased heat dissipation to keep the module at or below its maximum operating temperature in average and high ambient temperature conditions and increased thermal resistance to ambient while operating in low ambient conditions to keep the module at or above its minimum operating temperature.

BRIEF SUMMARY OF THE DISCLOSURE

In an embodiment, a thermal control system for pluggable optics in an optical platform includes a heatsink for dissipating heat from a pluggable optical module in the optical platform, the heatsink including a mating surface configured to make thermal contact with a module surface of the pluggable optical module inserted into the optical platform; and an actuator configured to manipulate the mating surface to change a contact area between the mating surface and the module surface such that the contact area between the mating surface and the module surface is larger for a temperature above a predetermined temperature than for a temperature below a predetermined temperature. The actuator can be configured to bend the heatsink such that at least a portion of the mating surface is separated from the module surface below the predetermined temperature to increase an average height of an air gap between the mating surface and the module surface. A coefficient of thermal expansion of the actuator can be different than the coefficient of thermal expansion of the heatsink such that a change in contact between the actuator and the heatsink occurs resulting in bending of the heatsink. The actuator can be positioned between protrusions extending from the heatsink, the actuator includes one or more wedges that shift to press outward on the protrusions when the temperature is below the predetermined temperature resulting in bending of the heatsink.

The actuator can be positioned between protrusions extending from the heatsink, the actuator includes a cam that rotates or a piston that extends to press outward on the protrusions when the temperature is below the predetermined temperature resulting in bending of the heatsink, and the actuator is passively or actively controlled. The actuator can include a combination of a rod or structure that has a coefficient of thermal expansion that is different than the coefficient of thermal expansion of the heatsink, one or more wedges, and a cam or a piston, that in combination cause bending of the heatsink below the predetermined temperature. The actuator can also be configured to lift at least a side of the heatsink from the pluggable optical module when the temperature is below the predetermined temperature. The actuator can be configured to lift at least a side of the heatsink from the pluggable optical module such that at least a portion of the mating surface is separated from the module surface below the predetermined temperature to increase an average height of an air gap between the mating surface and the module surface. The predetermined temperature can be a minimum desired operating temperature of the pluggable optical module or a threshold temperature that is above a minimum operating temperature of the pluggable optical module. The pluggable optical module, the heatsink, and the actuator can be configured to be enclosed in an optical platform enclosure that is hardened for outdoor or indoor mounting.

In another embodiment, a method for thermally controlling a pluggable optical module in an optical platform includes providing a heatsink for dissipating heat from a pluggable optical module in the optical platform, the heatsink including a mating surface configured to make thermal contact with a module surface of the pluggable optical module inserted into the optical platform; providing an actuator configured to manipulate the mating surface to change a contact area between the mating surface and the module surface; and passively or actively actuating the actuator such that the contact area between the mating surface and the module surface is larger for a temperature above a predetermined temperature than for a temperature below a predetermined temperature.

In a further embodiment, an optical platform a Printed Circuit Board (PCB) and associated components; a cage configured to receive a pluggable optical module, wherein the cage is mounted on the PCB; a heatsink for dissipating heat from the pluggable optical module, the heatsink including a mating surface configured to make thermal contact with a module surface of the pluggable optical module received into the cage; an actuator configured to manipulate the mating surface to change a contact area between the mating surface and the module surface such that the contact area between the mating surface and the module surface is larger for a temperature above a predetermined temperature than for a temperature below a predetermined temperature; and a housing enclosing the PCB, wherein the housing covers the PCB, the associated components, the cage with the pluggable optical module, the heatsink, and the actuator, with respect to airflow.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
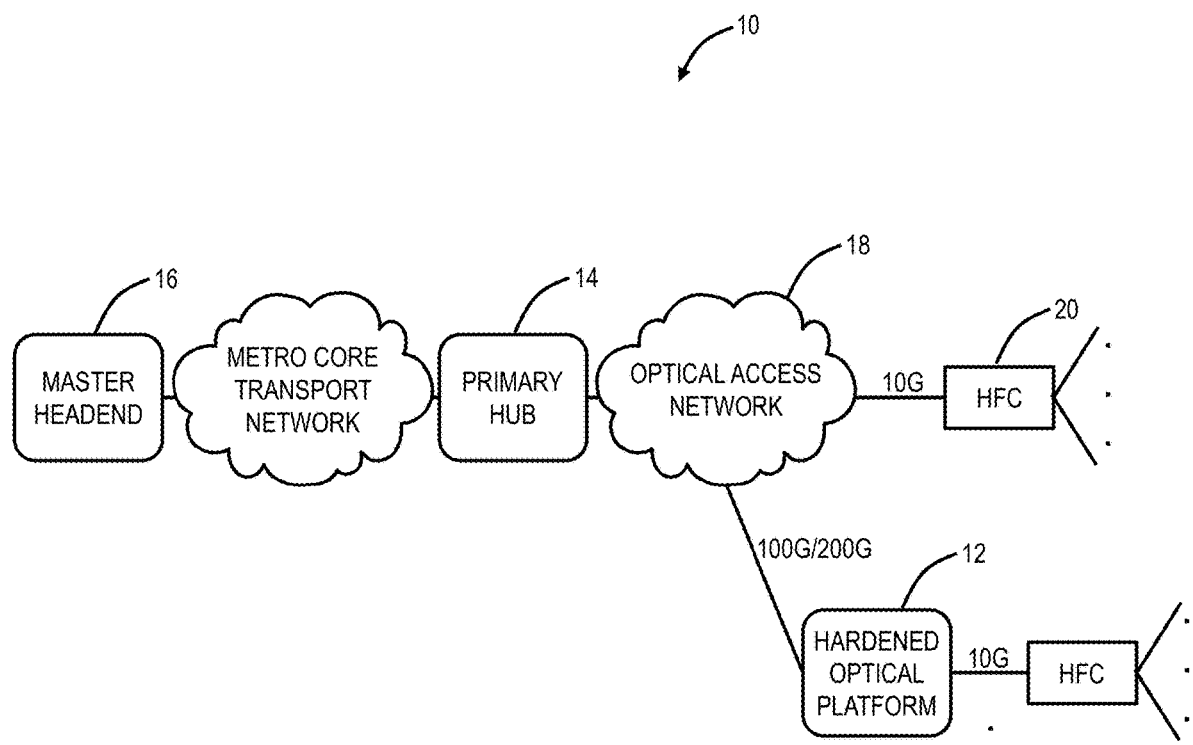
FIG. 1 is a network diagram of a network utilizing a hardened optical platform in a so-called "Fiber Deep" architecture.

In various embodiments, the present disclosure relates to a optical platforms, such as hardened optical platforms, with pluggable optics with a thermal control system. The optical platforms contemplates deployment in an outdoor plant system or the like. By hardened, the hardened optical platform is designed to be placed anywhere in the telecommunications environment, including any climate and any outdoor or indoor mounting. Thus, the hardened optical platform is sealed from harmful ingress, such as water. It is durable from corrosion, even in high-salt environments. Importantly, the hardened optical platform does not have air flow, vents, etc. permitting air exchange with the exterior.

The optical platforms supports pluggable optical modules with a thermal control system that includes a sliding heatsink to dissipate heat from the pluggable optical module once inserted into the housing. The sliding heatsink has a mating surface that is generally flat to minimize the average net air gap between a module surface of the pluggable optical module, and the heatsink. This configuration helps maintain the pluggable optical module temperatures below their maximum operating temperature but is in direct conflict with the need to keep the pluggable optical module temperatures above their minimum operation requirements at very low ambient conditions typically found in outside plant applications.

Thus, the thermal control system also includes an actuator that manipulates the heatsink, such as by bending, tilting, or lifting, to reduce the contact area between the mating surface and the module surface and to increase the average air gap between the mating surface and the module surface. This change in contact and average air gap height can be used to increase the thermal resistance between the pluggable optical module and the heatsink to maintain the pluggable optical module above their minimum operation requirements at very low ambient conditions.

Coherent Optics

Coherent optical technology uses a Digital Signal Processor (DSP) at both the transmitter and receiver, higher bit-rates, providing greater degrees of flexibility, simpler photonic line systems, and better optical performance. Fiber types and fiber impairments can be compensated for, leading to fewer regenerators and amplifiers, lowering costs, increasing transmission distances and adding traffic-handling capacity. Coherent optics can be implemented in either an integrated or pluggable optical module form factors. In the integrated approach, vendors customize solutions with their own technology and benefits. Pluggable coherent technologies can be split into two basic types: Analog Coherent Optics (ACO) and Digital Coherent Optics (DCO). ACOs consume less power by removing DSP functionality (and its hardware) from the pluggable optical module. The pluggable optical module communicates with the carrier circuit board using analog signals via a special connector and is where the DSP functionality resides. DCOs have the DSP function embedded within the pluggable optical module. This approach makes them more compatible with other vendors but consumes more power and has less vendor-specific technology.

For its part, coherent packet-optical combines the power of coherent optical transmission technology with packet fabric-based switching. It simplifies the network design and operations by eliminating the cost and complexity associated with deploying separate and physically distinct packet and optical platforms. It also facilitates future Distributed Access Architecture (DAA) and legacy Converged Cable Access Platform (CCAP) support.

"Fiber Deep"

FIG. 1 is a network diagram of a network 10 utilizing a hardened optical platform 12 in a so-called "Fiber Deep" architecture. Generally, the "Fiber Deep" architecture relates to including coherent optics closer to end users, including in outside plant configurations requiring the hardened optical platform 12. That is, the "Fiber Deep" architecture includes movement of fiber ever closer to customers requiring placement of the hardened optical platform 12 in non-controlled environments, i.e., outdoors.

The hardened optical platform 12 enables the use of pluggable optical modules (include ACO, DCO, and the like) in an outside plant deployment, such as the "Fiber Deep" architecture. Using the hardened optical platform 12, cable operators or the like can offer flexibility to boost fiber capacity to deliver more bandwidth and scalability between a hub 14 and headend 16 locations, and an optical access network 18 right to the network edge. Specifically, the optical access network 18 can connect directly to Hybrid Fiber Coax (HFC) devices 20, or through the hardened optical platform 12 to extend the fiber bandwidth such as support 100G/200G or more in the optical access network 18. In practical implementations, networking gear is targeted at one of two environments—commercial or industrial. Commercial environments are typically controlled, while industrial environments are referred to as "temperature hardened" or outdoor. Cable operators operate in both environments, using both outdoor cabinet and pole applications.

In an embodiment, the hardened optical platform 12 can be pole/strand-mounted and it can be a network element supporting modular packet and Optical Transport Networking (OTN) switching in the network 10. For example, the hardened optical platform 12 can support 24×10G client ports (facing the HFC, for example) and 2×100G/200G line ports (facing the optical access network 18).

Those skilled in the art will recognize the network 10 is presented for illustration purposes as one possible application for the hardened optical platform 12 described herein. Other embodiments are also contemplated. The objective of the hardened optical platform 12 is to provide a hardened platform that supports pluggable optical modules including coherent optics such as ACO, DCO, etc. such that these pluggable optical modules can be deployed outside of controlled environments.

Hardened Optical Platform

Figure 2:
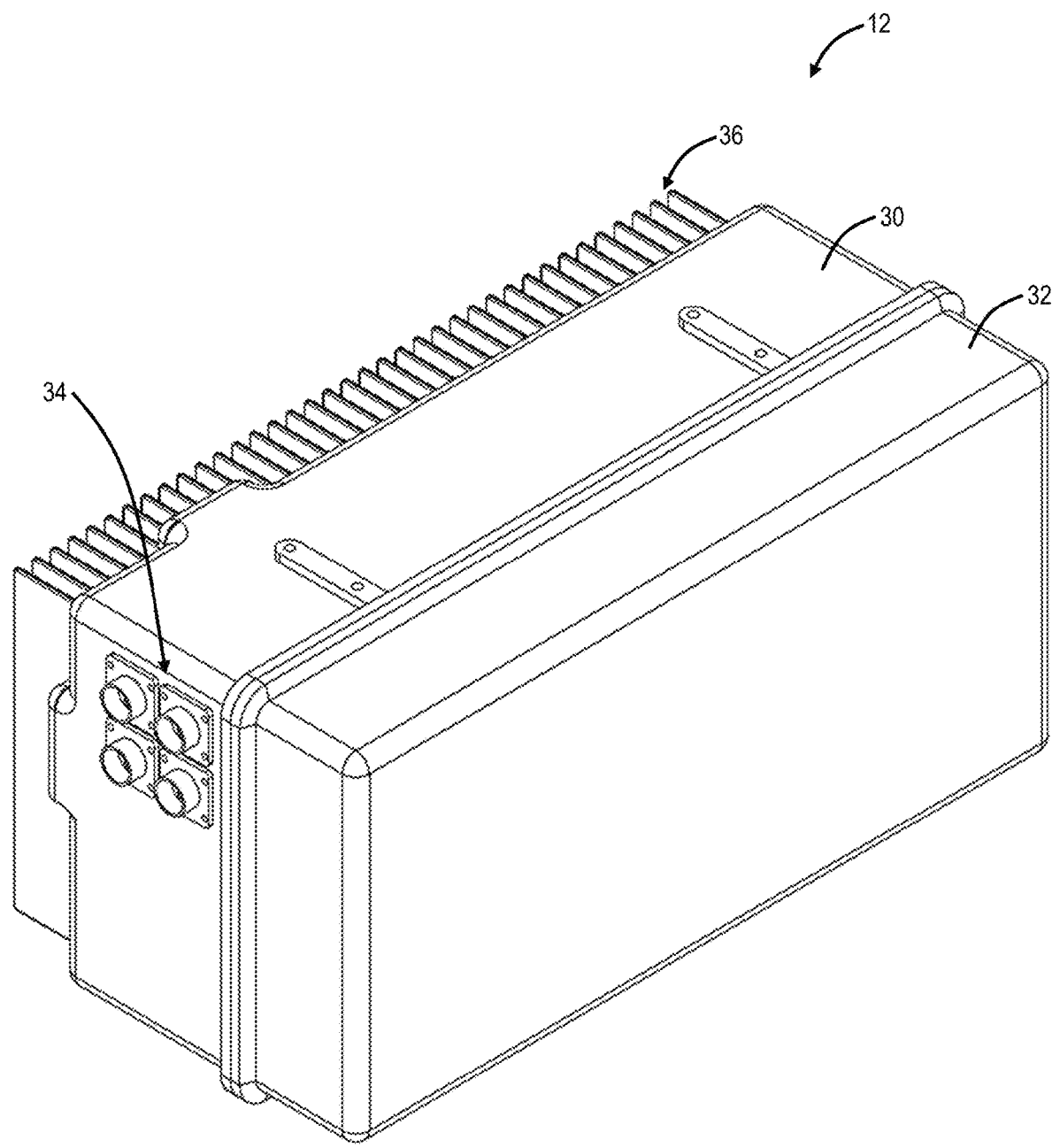
FIG. 2 is a perspective diagram of the enclosure of the hardened optical platform with a door closed.
Figure 3:
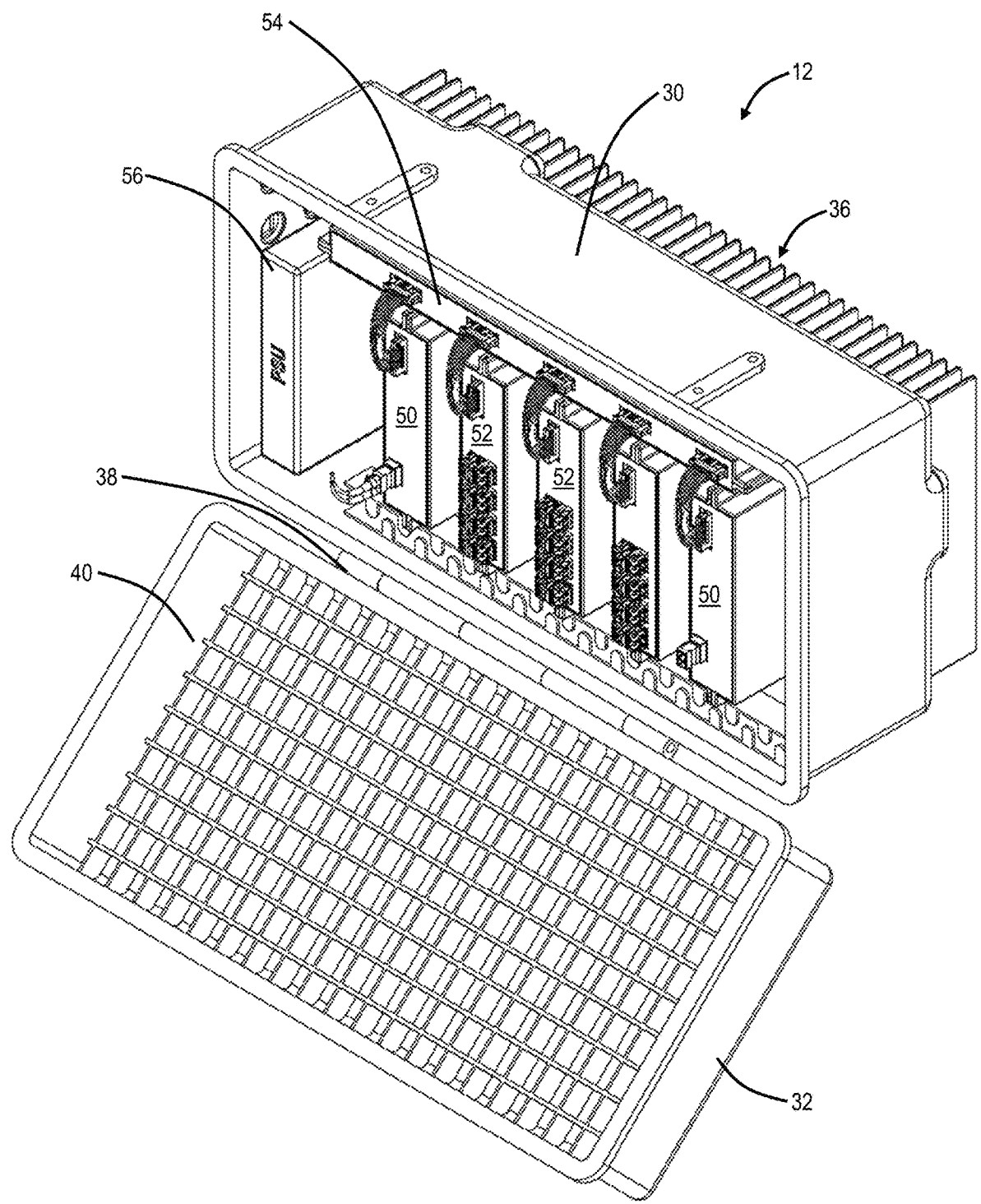
FIG. 3 is a perspective diagram of the enclosure of the hardened optical platform with the door open.
Figure 4:
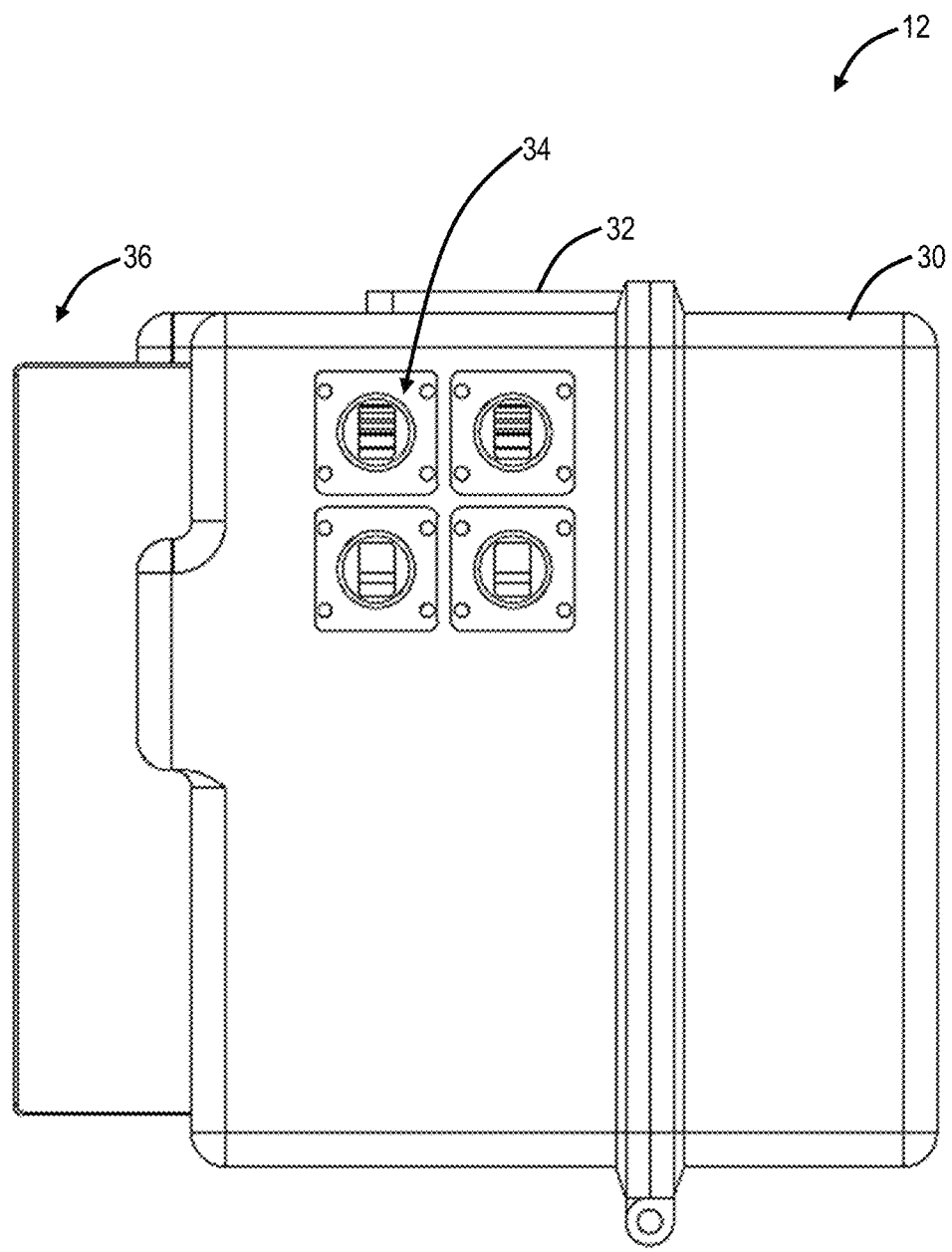
FIG. 4 is a side view diagram of the enclosure of the hardened optical platform illustrating fiber and power access ports in the enclosure.
Figure 5:
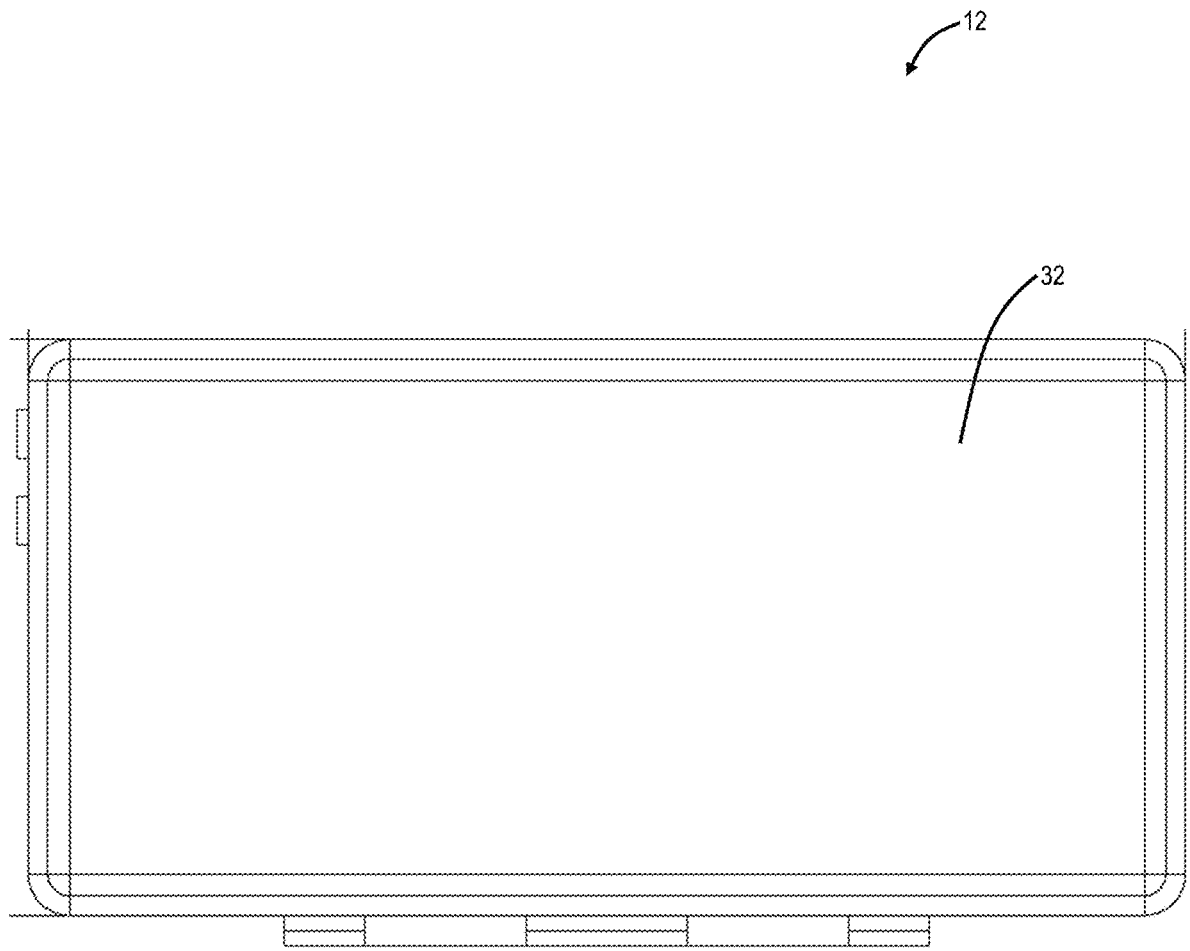
FIG. 5 is a front view diagram of the door of the hardened optical platform.
Figure 6:
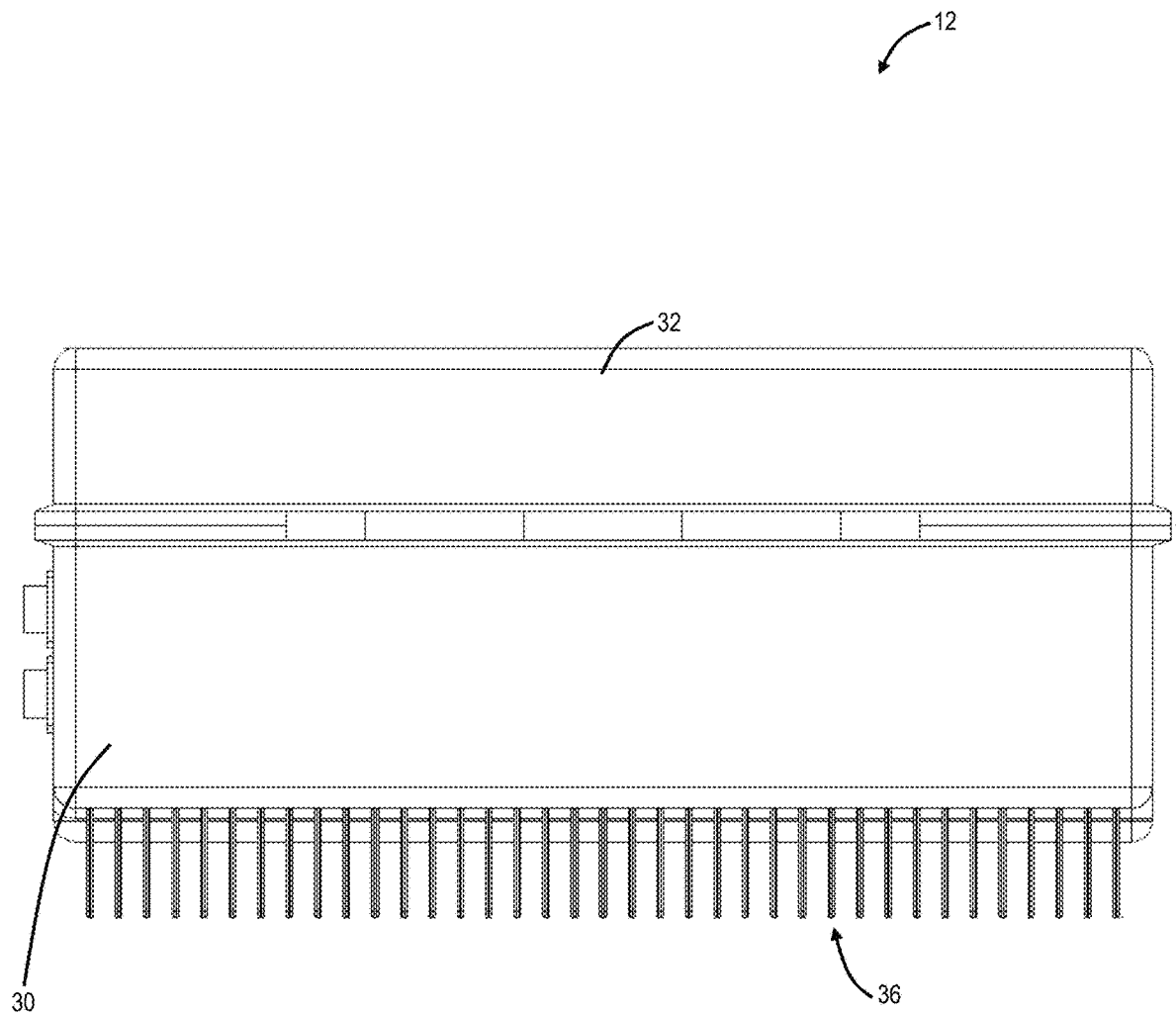
FIG. 6 is a top view diagram of the enclosure of the hardened optical platform with the door closed.
Figure 7:
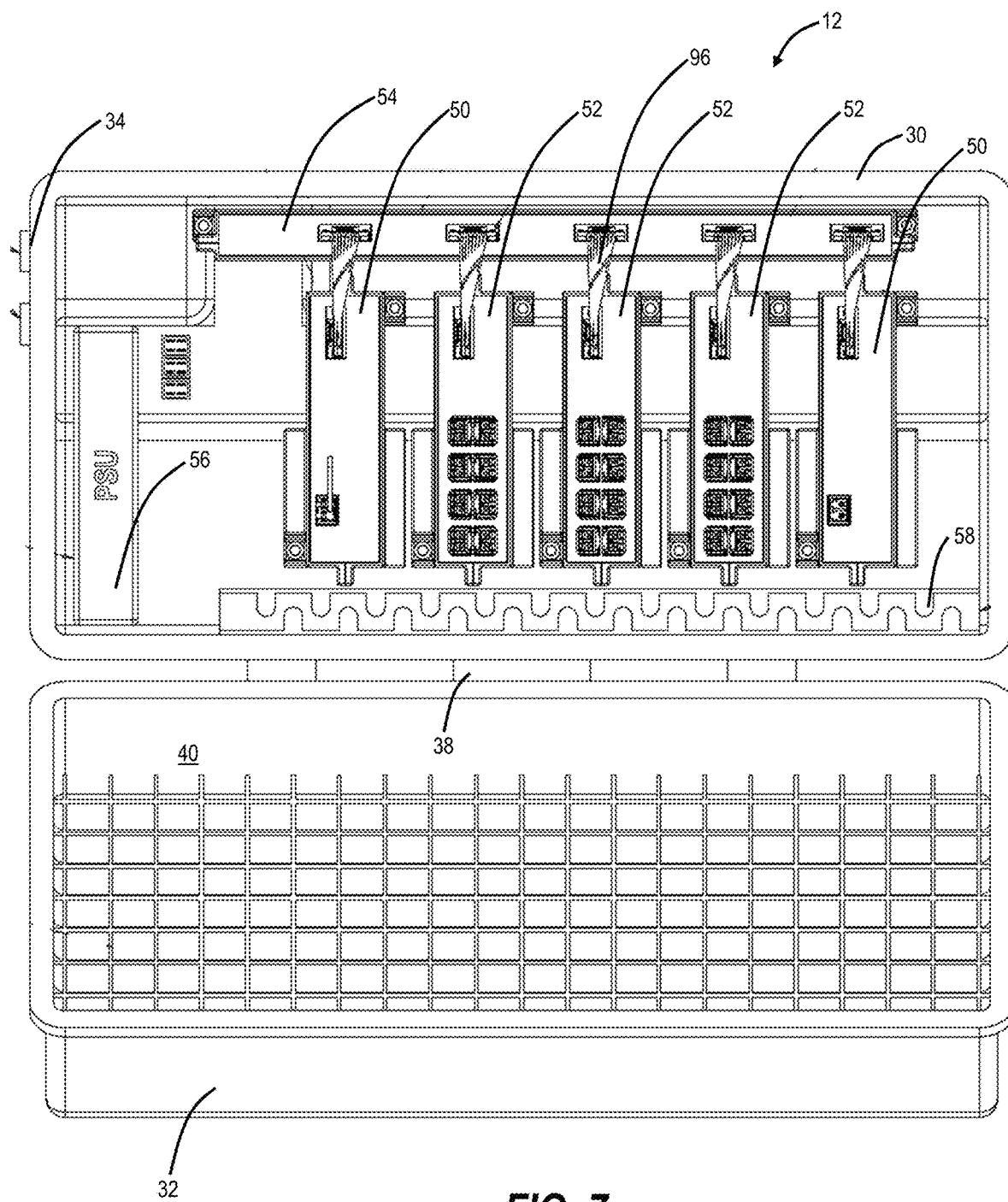
FIG. 7 is a front view diagram of the hardened optical platform with the door open.

FIGS. 2-7 are diagrams of an enclosure 30 of the hardened optical platform 12. Specifically, FIG. 2 is a perspective diagram of the enclosure 30 of the hardened optical platform 12 with a door 32 closed, FIG. 3 is a perspective diagram of the enclosure 30 of the hardened optical platform 12 with the door 32 open, FIG. 4 is a side view diagram of the enclosure 30 of the hardened optical platform 12 illustrating fiber and power access ports 34 in the enclosure 30, FIG. 5 is a front view diagram of the door 32 of the hardened optical platform 12, FIG. 6 is a top view diagram of the enclosure 30 of the hardened optical platform 12 with the door 32 closed, and FIG. 7 is a front view diagram of the hardened optical platform 12 with the door 32 open.

The hardened optical platform 12 includes the enclosure 30 and the door 32 which can be any hardened material, i.e., which is environmentally sealed to water, wind, etc. Specifically, the hardened optical platform 12, via the enclosure 30 and the door 32, is weatherproof. The enclosure 30 can include the fiber and power access ports 34 on a side enabling cables to be routed into the interior. In an embodiment, the enclosure 30 is fixed, and the door 32 can rotatably open for interior access. The enclosure 30 can also include heat fins 36 on a rear portion to move heat generated in the interior to the environment via convection. Again, there is no airflow between the interior and the environment.

In an embodiment, the hardened optical platform 12 can be mounted on a pole or the like. In another embodiment, the hardened optical platform 12 can be placed on a pedestal or some other outdoor location, such as street level cabinets. In a further embodiment, the hardened optical platform 12 can be mounted on a building exterior or the like.

In an embodiment, the hardened optical platform 12 can have a rectangular shape. Example dimensions can include 270 mm×540 mm×270 mm (H×W×D). For example, the hardened optical platform 12 can have a similar size/functionality of a 1-2 Rack Unit (RU) mountable system (e.g., a "pizza box").

In FIGS. 3 and 7, the door 32 is shown open. The door 32 can open and rotate downward about a hinge 38 on a front of the enclosure 30. A front cover 40 of the door 32 can include space and guides for fiber management and fiber splicing.

The hardened optical platform 12 can include various modules which can be field replaceable. Again, in FIGS. 3 and 7, the modules can include a line module 50, a client module 52, switch module 54, and a power supply unit (PSU) 56. Of course, other types of modules are contemplated. Also, the hardened optical platform 12 can include a fiber tray 58 located underneath the modules 50, 52 for fiber slack routing and storage.

The hardened optical platform 12 can operate with or without a backplane. In this example, there is both a backplane (FIG. 13) and cable connections between the modules 50, 52 and the switch module 54. Again, other embodiments are also contemplated.

Hardened Optical Platform Modules

Figure 8:
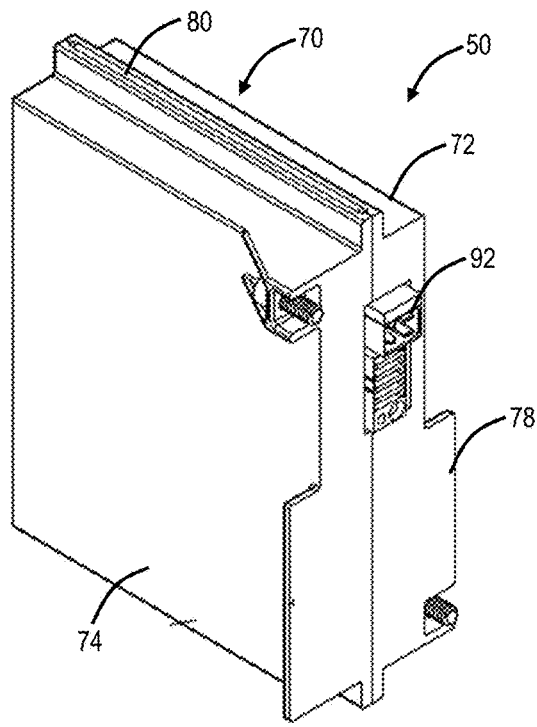
FIG. 8 is a perspective diagram of a front and rear view of a line module for the hardened optical platform.
Figure 8:
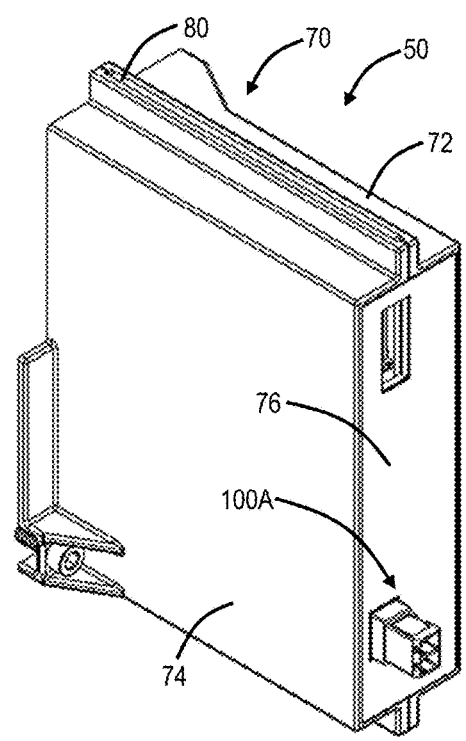
Figure 9:
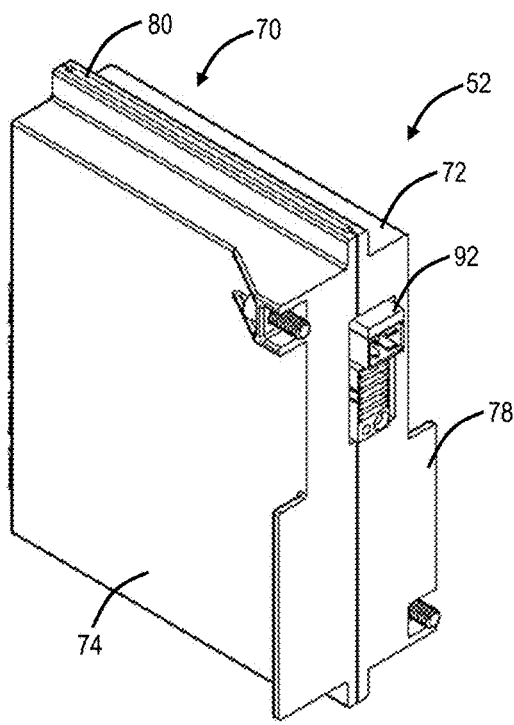
FIG. 9 is a perspective diagram of a front and rear view of a client module for the hardened optical platform.
Figure 9:
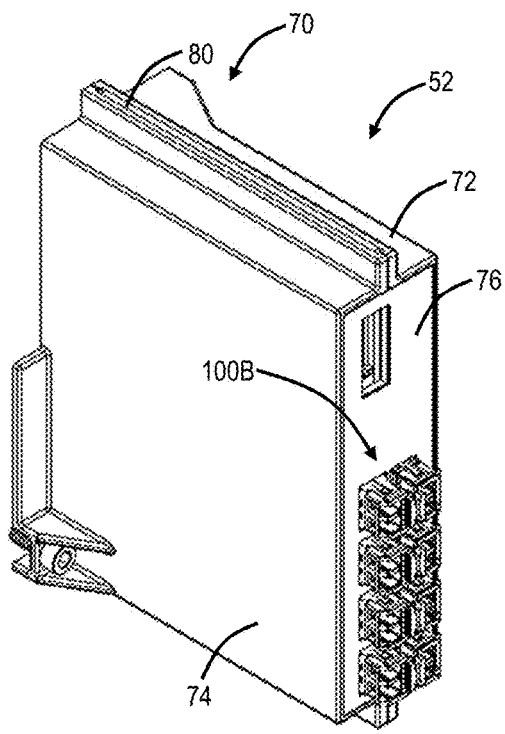
Figure 10:
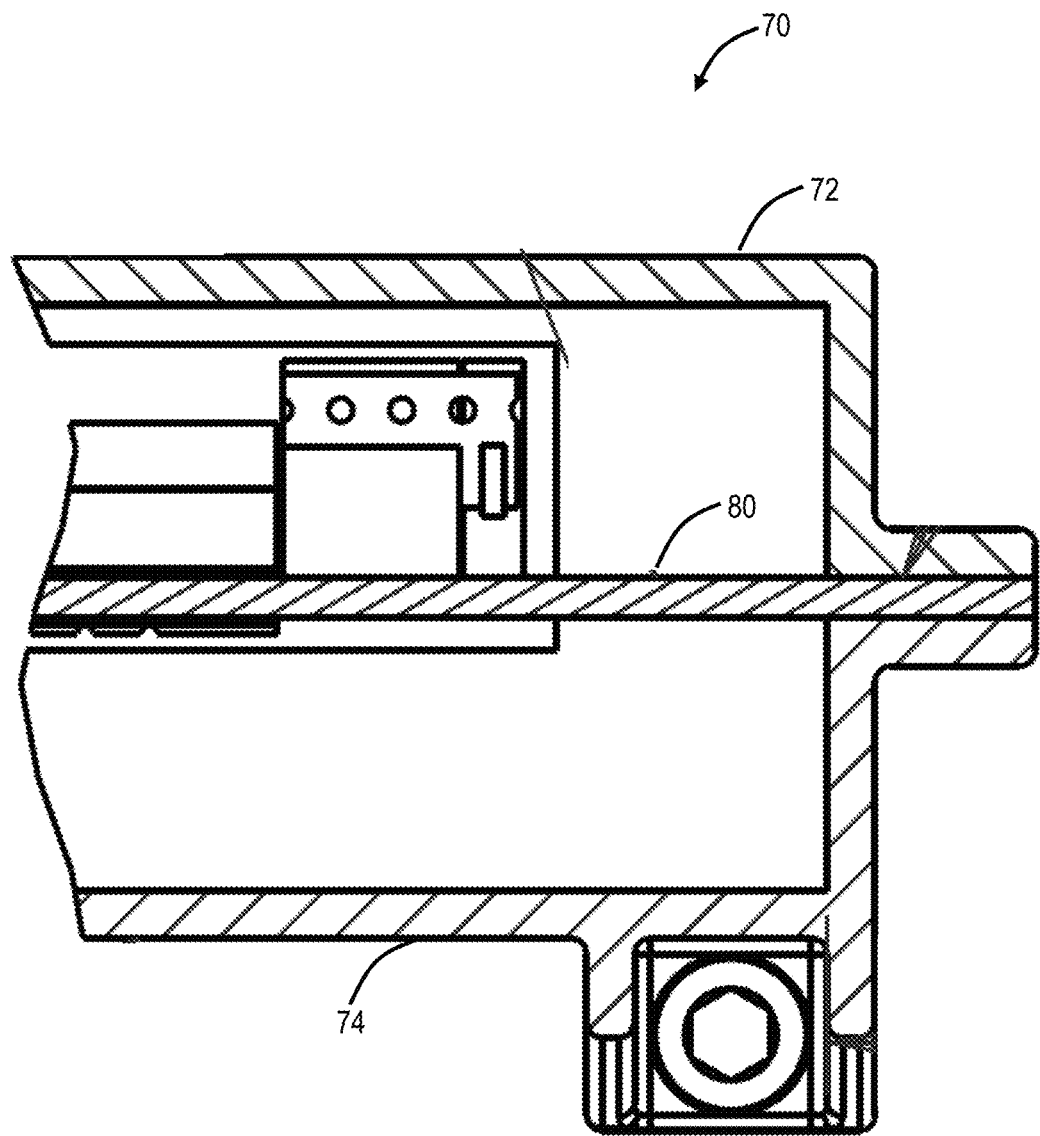
FIG. 10 is a cross-sectional diagram of a housing associated with the line, client, and switch modules in the hardened optical platform.
Figure 11:
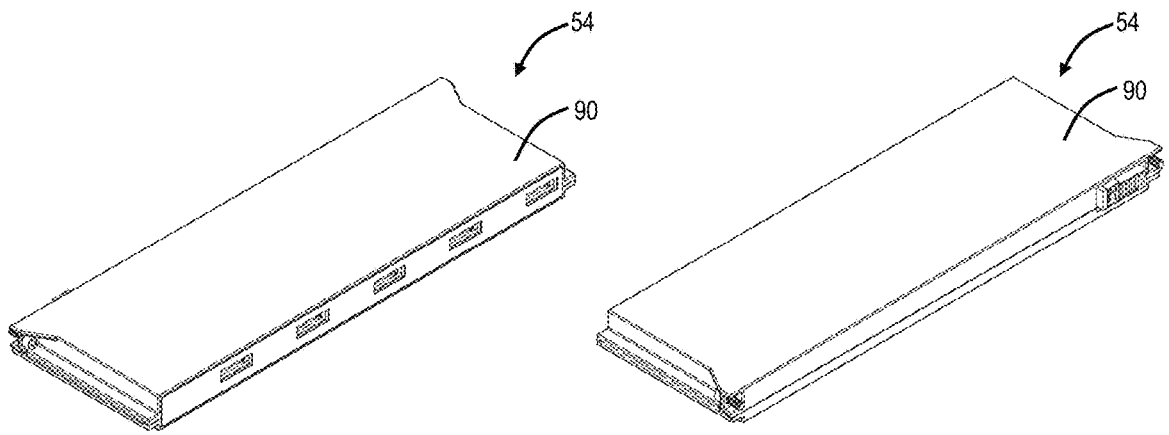
FIG. 11 is a perspective diagram of a front and rear view of the switch module in the hardened optical platform.
Figure 12:
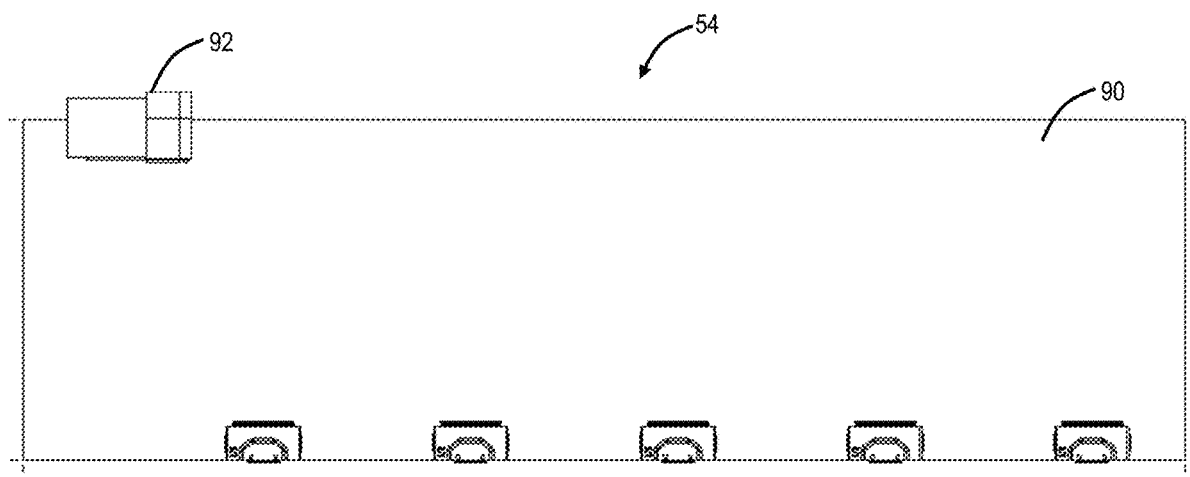
FIG. 12 is a perspective diagram of a top view of the switch module of FIG. 11.
Figure 13:
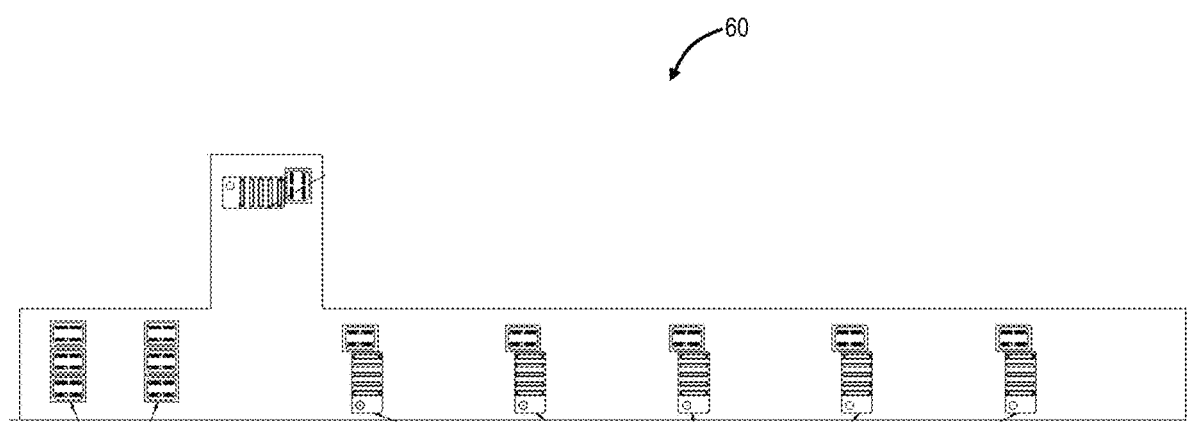
FIG. 13 is a diagram of a front view of a backplane in the hardened optical platform.

FIGS. 8-13 are diagrams of various modules 50, 52, 54 and a backplane 60 associated with the hardened optical platform 12. Specifically, FIG. 8 is a perspective diagram of a front and rear view of the line module 50, FIG. 9 is a perspective diagram of a front and rear view of the client module 52, FIG. 10 is a cross-sectional diagram of a housing 70 associated with the modules 50, 52, 54, FIG. 11 is a perspective diagram of a front and rear view of the switch module 54, FIG. 12 is a perspective diagram of a top view of the switch module 54, and FIG. 13 is a diagram of a front view of the backplane 60 in the hardened optical platform 12.

In this example, these modules can form the functionality of the hardened optical platform 12 in FIG. 1, namely 100G/200G from the optical access network 18 and 10G or the like connections to end users, HFC, etc. In an embodiment, the hardened optical platform 12 can support two-line modules 50, such as for working and protection (1+1, ring, mesh, etc.), and three client modules 52 for client interfaces. Again, other embodiments are contemplated. Both the line module 50 and the client module 52 support pluggable optical modules 100 with novel thermal management as described herein.

The line modules 50 each can include a single pluggable optical module 100A. The pluggable optical module 100A can be a coherent pluggable module, such as ACO, DCO, etc. The client modules 52 each can include eight Small Form Factor Pluggable (SFP) pluggable optical modules 100B. For example, assume the SFP pluggable optical modules 100B each operate at 10G, with three client modules 52, the hardened optical platform 12 can have 240G of client interfaces. The pluggable optical module 100A can be 200G+ via coherent optics. The switch module 54 is configured to provide packet switching between the line modules 50 and the client modules 52. Thus, the hardened optical platform 12 can support 200G+ packet switching in an outside plant configuration.

In FIGS. 8 and 9, the modules 50, 52 are fully enclosed modules with the housing 70 having a first side 72, a second side 74, a front faceplate 76, and a rear thermal contact surface 78. Thus, a Printed Circuit Board (PCB) 80 with associated electronics and optics for the modules 50, 52 are fully closed via the housing 70. The housing 70 can be referred to as a clamshell, and the housing 70 can conduct heat from the PCB 80 to the rear thermal contact surface 78. As shown in FIG. 10, the PCB 80 is "sandwiched" between the first side 72 and the second side 74 of the housing 70 for heat removal. The housing 70 is configured to cover various components in the associated module 50, 52, 54.

Figure 14:
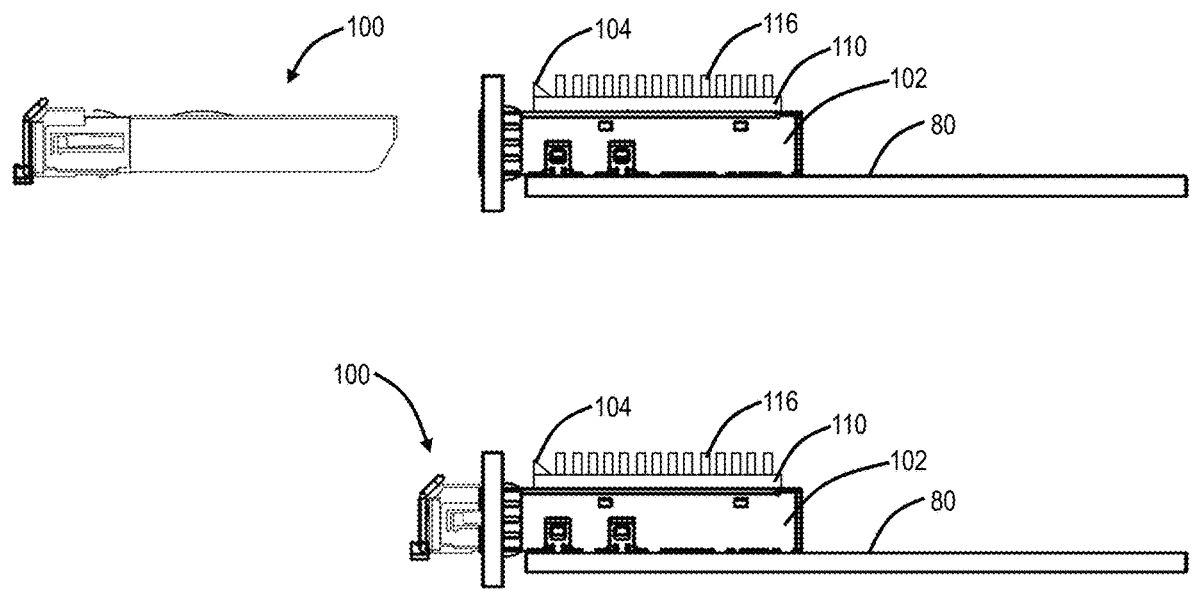
FIG. 14 is a diagram of a pluggable optical module inserted into a cage on a Printed Circuit Board (PCB)

The rear thermal contact surface 78 can be thermally conductive to the heat fins 36 on the rear portion of the enclosure 30. Thus, one means of heat transfer can be at the rear of the hardened optical platform 12. The modules 50, 52, 54, 56 can be affixed to the enclosure 30 via a mechanical connection that provides a large contact force and low thermal impedance. As illustrated in FIG. 14 and described in greater detail below, the modules 50, 52, 54, 56 can be affixed to the enclosure via a cage, and one or more heatsinks can be positioned to be in thermal contact with a surface(s) of the modules 50, 52, 54, 56 for heat removal.

In FIGS. 11 and 12, similar to the modules 50, 52, the switch module 54 also includes a housing 90. The switch module 54 connects to the modules 50, 52 via a connector ribbon on the front side of each of the modules 50, 52, 54. Further, each of the modules 50, 52, 54 include rear-side connectors 92 which connect to the backplane 60 in FIG. 13. For example, the rear-side connectors 92 can provide power and telemetry connections whereas the connector ribbon can provide data connectivity. Again, other embodiments are contemplated.

The switch module 54 is arranged perpendicular to the other modules 50, 52 and runs along the length of the enclosure 30 to facilitate connection to the modules 50, 52. This minimizes the length any signal must travel to the switch module 54. Further, the connections 96 can be a high-speed signal cable to connect the modules, reducing or eliminating the need for the backplane 60. Also, the size of the switch module 54 and the high-speed signal cable pitch can be chosen such that the same cable can be used to interconnect different types of modules.

In FIG. 7, connections 96 are shown on the front side between the modules 50, 52 and the switch module 54. Although connections between the modules 50, 52, 54 may be made entirely via the backplane 60, FIG. 7 illustrates the addition of very short, high speed signal cables, namely the connections 96. The connections 96 can be a more efficient approach of data transfer than the backplane. In this implementation, the connectors 92 at the rear of the modules 50, 52 can be reduced or eliminated, allowing the surface of the rear thermal contact surface 78 in contact with the outdoor enclosure 30 to be enlarged. This further improves the heat transfer to the outside enclosure 30.

Pluggable Optical Modules and Thermal Management in the Optical Platform

As shown in FIG. 14, a pluggable optical module 100 can be inserted into a cage 102 mounted on a PCB 80 within a housing, such as housing 70 disclosed above. One or more heatsinks 110 can be positioned to mate with a surface(s) of the pluggable optical module 100. The heatsink(s) 110 can be held in place by one or more spring mechanisms 104. The spring mechanisms 104 may ensure that there is maximum contact between the flat mating surfaces of the heatsink 110 and the surface of the pluggable optical module 100, which provides a low thermal resistance and permits heat to be conducted away from the pluggable optical module 100 by the heatsink 110.

As shown in FIGS. 15-27 one or more actuators 120, 130, 140, 150, 160 or combination of actuators 120, 130, 140, 150, 160 is added, which is configured to manipulate a mating surface 111 of the heatsink, such as by bending, tilting, and/or lifting the heatsink 110, to change a contact area between a mating surface 111 of the heatsink 110 and a module surface 101 of the pluggable optical module 100, such that a contact area between a mating surface 111 and a module surface 101 decreases (i.e. increases the area out of contact between the mating surface 111 and the module surface 101) and an average height of an air gap between the mating surface 111 and the module surface 101 increases when an activation temperature is reached or approached. Thus, the contact area between the mating surface 111 and the module surface 101 is larger for a temperature above the activation temperature than for a temperature below the activation temperature, and the average height of an air gap between the mating surface 111 and the module surface 101 is smaller for a temperature above the activation temperature than for a temperature below the activation temperature.

The activation temperature is a predetermined temperature that can be a minimum desired operating temperature of the module, a threshold temperature that is above a minimum operating temperature of the module, a threshold minimum external temperature, a threshold temperature that is passed while external temperatures are dropping to the minimum external temperature, a threshold internal enclosure temperature, or the like.

Figure 15:
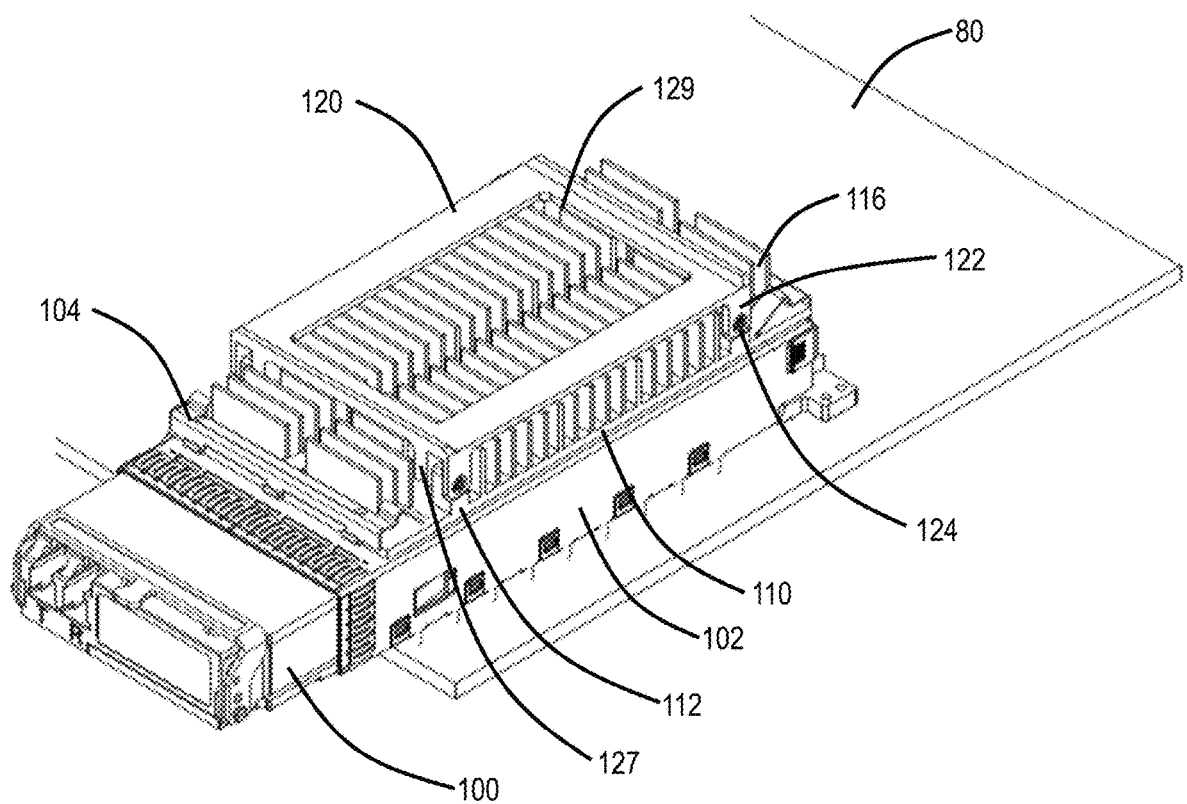
FIG. 15 is a perspective diagram of a thermal control system and pluggable optical module inserted into a cage on a PCB.
Figure 16:
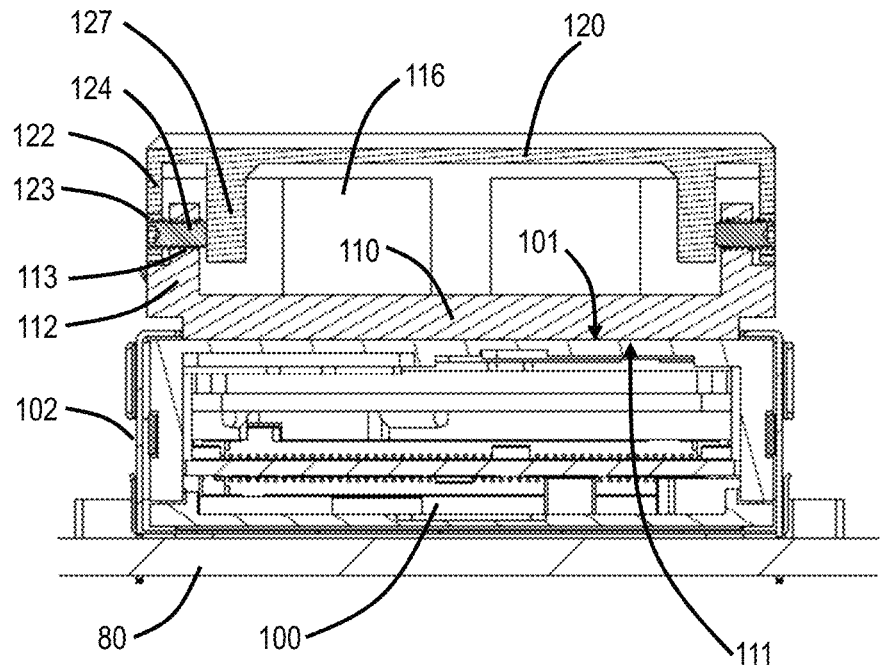
FIG. 16 is a cross-sectional diagram of a thermal control system and pluggable optical module inserted into a cage on a PCB.
Figure 17:
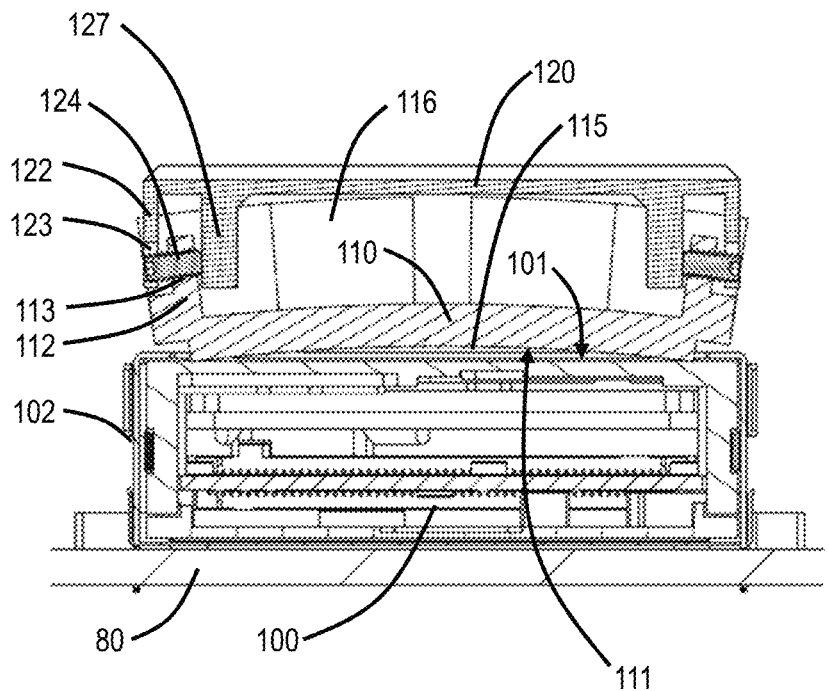
FIG. 17 is a cross-sectional diagram of the thermal control system and pluggable optical module inserted into a cage on a PCB of FIG. 16 with a bent heatsink.

In FIGS. 15-17, actuator 120 is a passive actuator. Actuator 120 is a structure, such as a frame, chassis, etc., that connects to opposing sides and/or ends of the heatsink 110. Mounts 112 can extend from heatsink 110 which are configured to provide a connection of actuator 120 to the heatsink 110. The mounts 112 may be formed integral with heatsink 110 and may extend in a direction opposite the mating surface 111, away from the pluggable optical module 100.

Actuator 120 has a different coefficient of thermal expansion (CTE) than that off heatsink 110, such as a lower CTE than the heatsink 110. The different CTE of the actuator 120 causes the heatsink 110 to bend, such as into a concave or convex shape, at and below the activation temperature, which causes the contact area between the mating surface 111 and the module surface 101 to decrease and the average height of the air gap 115 between the mating surface 111 and the module surface 101 to increase (refer to FIG. 17).

Actuator 120 includes contact surfaces 126 that contact the heatsink 110, directly or indirectly, such that the actuator 120 interferes with a contraction of the heatsink 110 at the activation temperature due to the different CTEs of the actuator 120 and the heatsink 110, resulting in the bending of the heatsink 110. The contact surfaces 126 can be on protrusions 127 extending from a body 125 of the actuator 120, such that the contact surfaces 126 are positioned inside of the mounts 112.

Actuator 120 can include legs 122 extending from the body 125 that position the actuator 120 relative to the heatsink 110 and support the actuator 110 by contacting the heatsink 110, such as at the mounts 112. Actuator 120 can also include one or more openings 129, which may provide for heat dispersion by the heatsink 110, such as via fins 116.

Adjustment mechanisms 124 can be included, which can be set so that contact with the actuator 120, such as at contact surfaces 126, occurs at a selected activation temperature. Adjustment mechanisms 124 can be screws, such as socket set screws, and the like, which are set in threaded holes 113 of the mounts 112. The adjustment mechanisms 124 can be accessed via clearance holes 123 on the legs 122.

In FIGS. 18-21 actuator 130 includes one or more wedges 131, 132, 133 positioned in a gap 117 between protrusions, such as fins 116, extending from the heatsink 110. Actuator 130 actuates the wedge(s) 131, 132, 133 passively or actively to be in contact, such as in an interference condition, with the protrusions and push the protrusions apart below the activation temperature, where the contact and applied force may be initiated at the activation temperature. The motion and orientation of the wedge(s) 131, 132, 133 may be adapted as necessary to effectuate the forces necessary to push the protrusions apart and bend the heatsink 110. This bending causes the contact area between the mating surface 111 and the module surface 101 to decrease and the average height of the air gap 115 between the mating surface 111 and the module surface 101 to increase (refer to FIG. 19).

Figure 18:
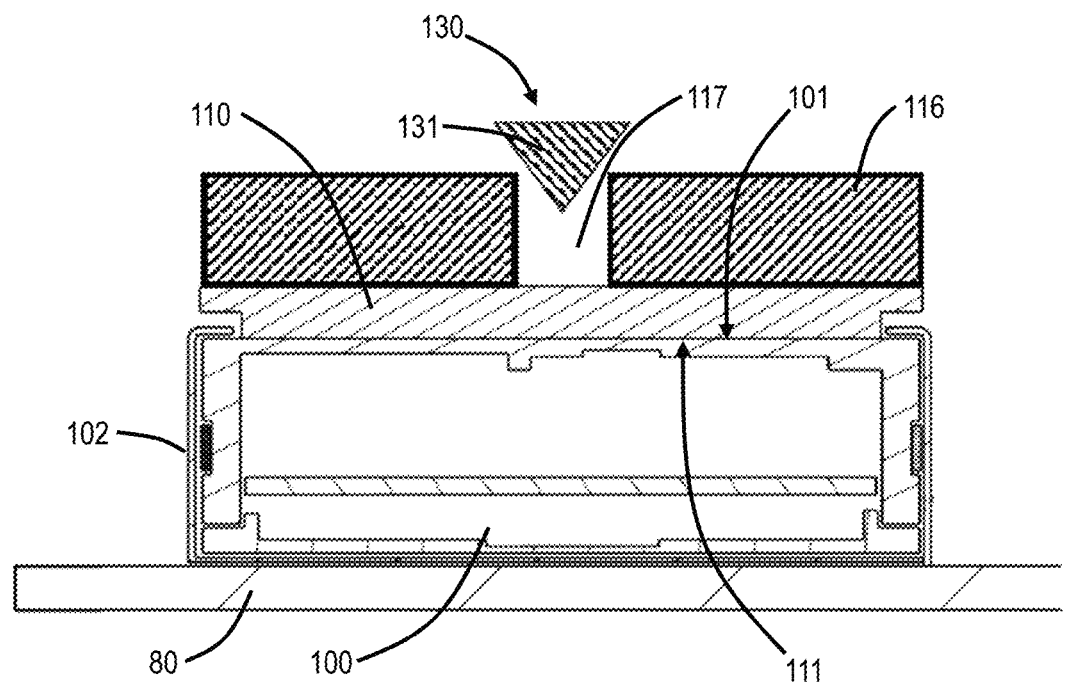
FIG. 18 is a cross-sectional diagram of a thermal control system and pluggable optical module inserted into a cage on a PCB.
Figure 19:
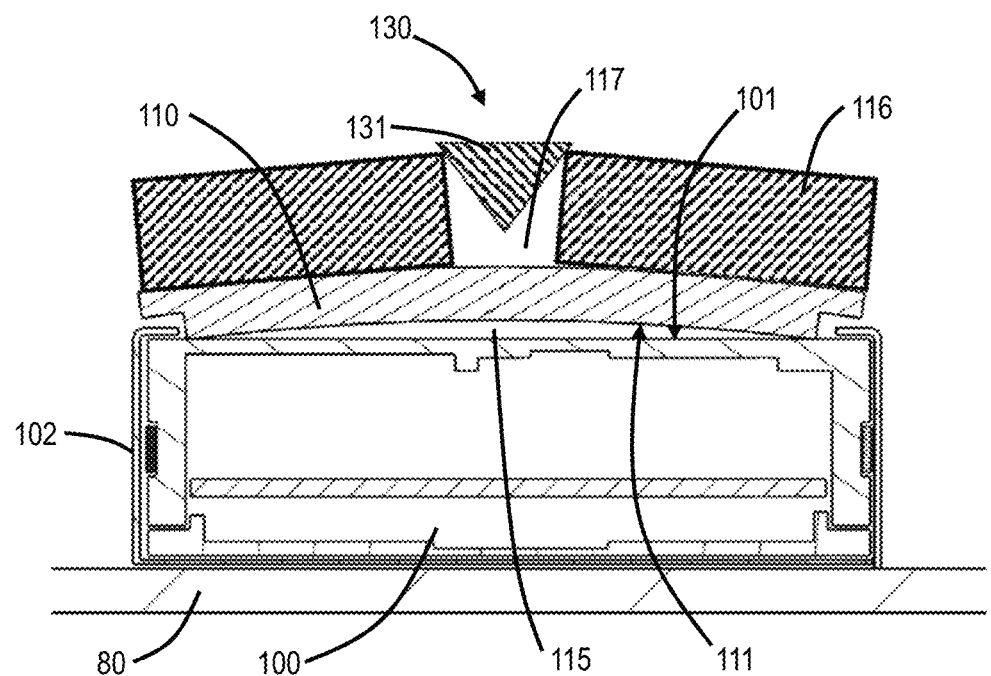
FIG. 19 is a cross-sectional diagram of the thermal control system and pluggable optical module inserted into a cage on a PCB of FIG. 18 with a bent heatsink.

In FIGS. 18 and 19 the wedge 131 is actuated vertically so that a thicker portion of the wedge 131 contacts the protrusions of the heatsink 110 to bend the heatsink 110. The wedge 131 may be actuated passively, such as by a rod that expands and contracts such that the wedge 131 is pushed or pulled to contact the protrusions below the activation temperature.

The wedge 131 may also be actuated actively, such as by a cam that is rotated at the activation temperature to push the wedge 131 into contact with the protrusions below the activation temperature, a piston that expands at the activation temperature to push the wedge 131 into contact with the protrusions below the activation temperature, and the like.

Multiple wedges 131, 132, 133 may overlap with each other or with other shapes such that when the wedges 131, 132, 133 are pushed together their profile between the protrusions of the heatsink 110 expands to contact the protrusions and push the protrusions apart below the activation temperature and cause the contact area between the mating surface 111 and the module surface 101 to decrease and the average height of the air gap 115 between the mating surface 111 and the module surface 101 to increase.

Figure 20:
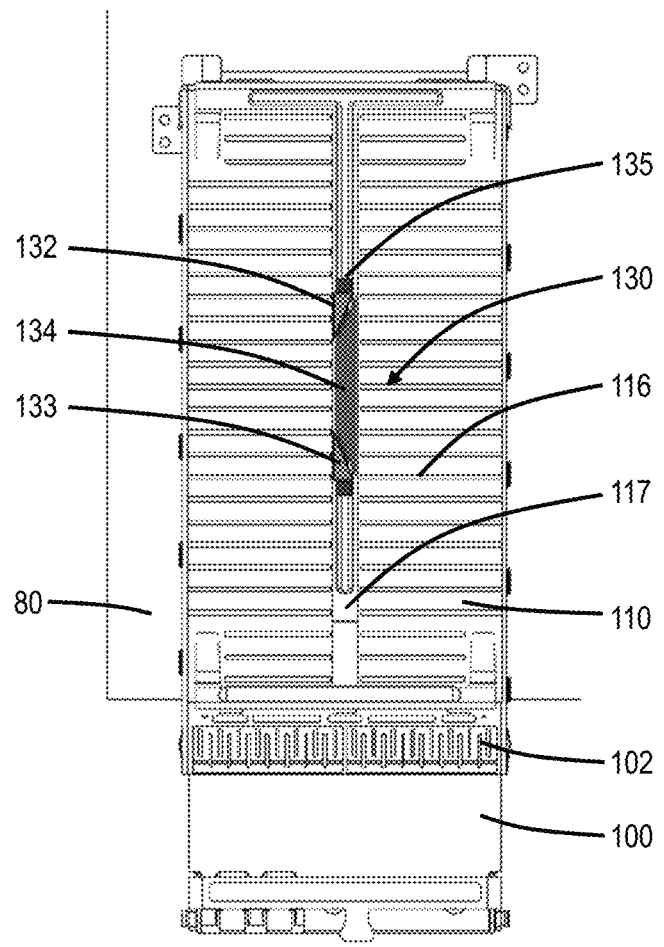
FIG. 20 is a perspective diagram of a top view of a thermal control system and pluggable optical module inserted into a cage on a PCB.
Figure 21:
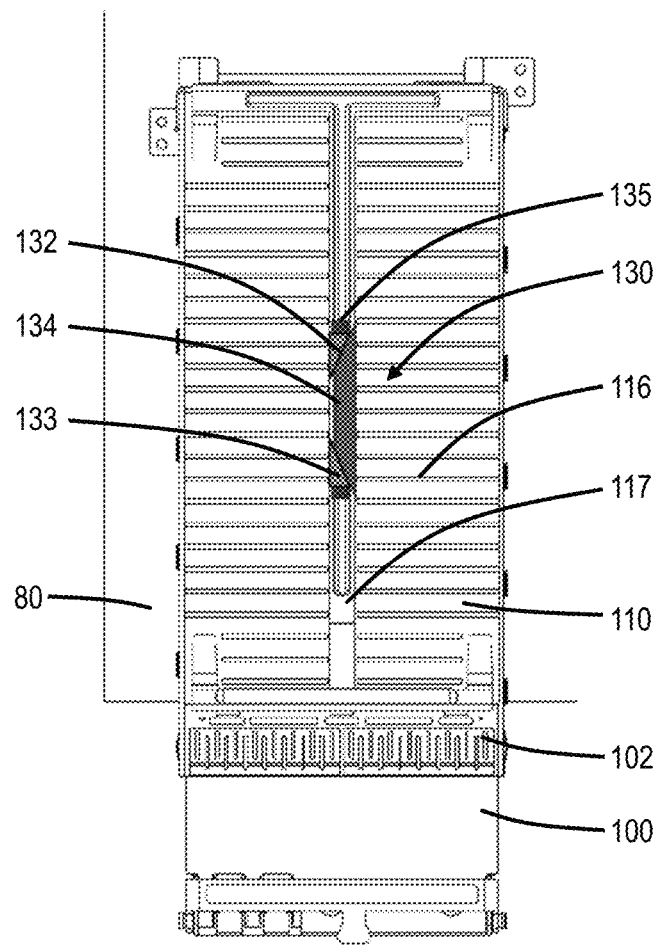
FIG. 21 is a perspective diagram of a top view of the thermal control system and pluggable optical module inserted into a cage on a PCB of FIG. 20 with a bent heatsink.

In FIGS. 20 and 21 wedges 132 and 133 are positioned adjacent opposite ends of a trapezoid 134. A rod 135 extends through the wedges 132, 133 and the trapezoid 134, and includes ends configured to pull the wedges together as the rod 135 contracts resulting in the expanded profile that causes the contact area between the mating surface 111 and the module surface 101 to decrease and the average height of the air gap 115 between the mating surface 111 and the module surface 101 to increase below the activation temperature, which may initiate at the activation temperature.

Actuator 130 can be used in conjunction with actuator 120 to bend the heatsink 110 and cause the contact area between the mating surface 111 and the module surface 101 to decrease and the average height of the air gap 115 between the mating surface 111 and the module surface 101 to increase below the activation temperature.

Figure 22:
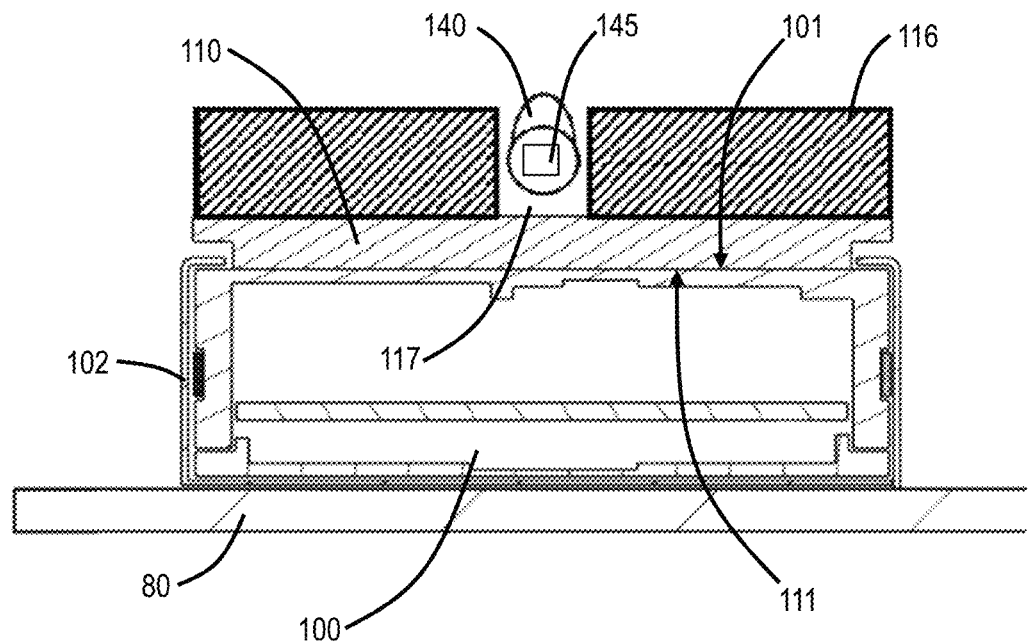
FIG. 22 is a cross-sectional diagram of a thermal control system and pluggable optical module inserted into a cage on a PCB.
Figure 23:
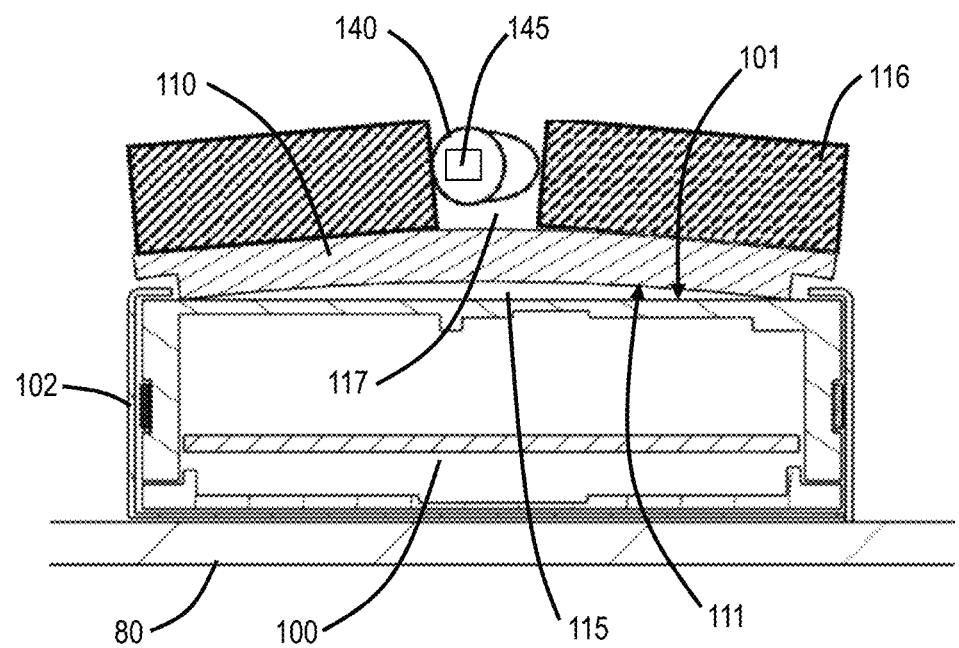
FIG. 23 is a cross-sectional diagram of the thermal control system and pluggable optical module inserted into a cage on a PCB of FIG. 22 with a bent heatsink.

In FIGS. 22 and 23 actuator 140 is positioned between protrusions, such as fins 116, extending from the heatsink 110. Actuator 140 can be a cam that is rotated to contact the protrusions, such as in an interference condition, and push the protrusions apart below the activation temperature and cause the contact area between the mating surface 111 and the module surface 101 to decrease and the average height of the air gap 115 between the mating surface 111 and the module surface 101 to increase. The rotation of actuator 140 may be initiated at the activation temperature to rotate the actuator 140 into contact with the protrusions as the temperature decreases and to rotate the actuator 140 out of contact with the protrusions as the temperature increases.

Rotation of actuator 140 may be passively or actively controlled by driver 145. Driver 145 may be a passive driver, such as a bimetal driver, that is configured to twist the cam. Driver 145 may be an active driver that includes a motor that is controlled by a controller using a sensor to measure the temperature, which rotates the actuator 140 at the activation temperature.

Figure 24:
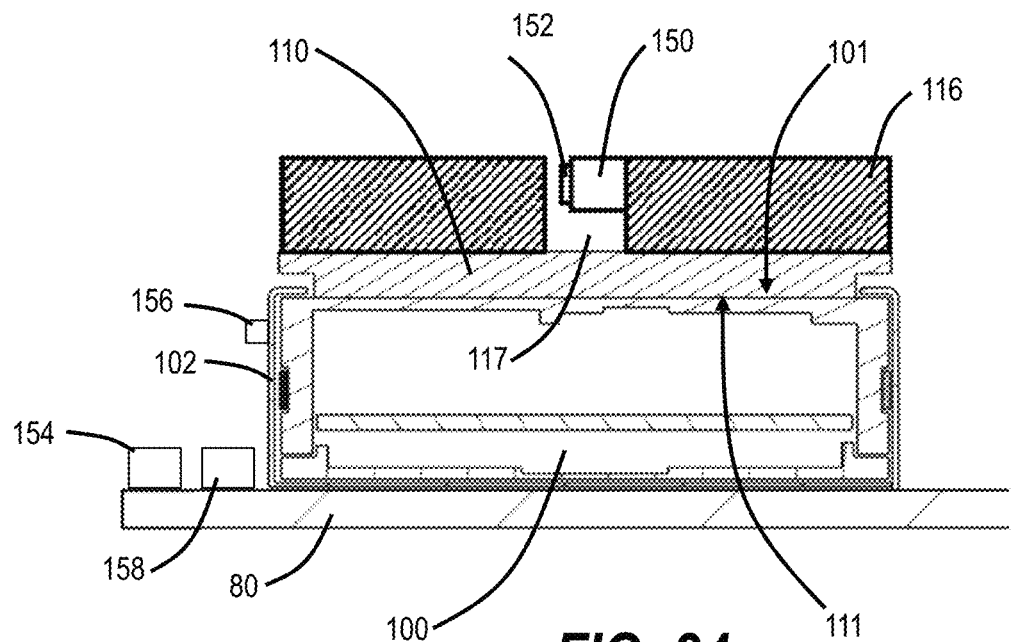
FIG. 24 is a cross-sectional diagram of a thermal control system and pluggable optical module inserted into a cage on a PCB.
Figure 25:
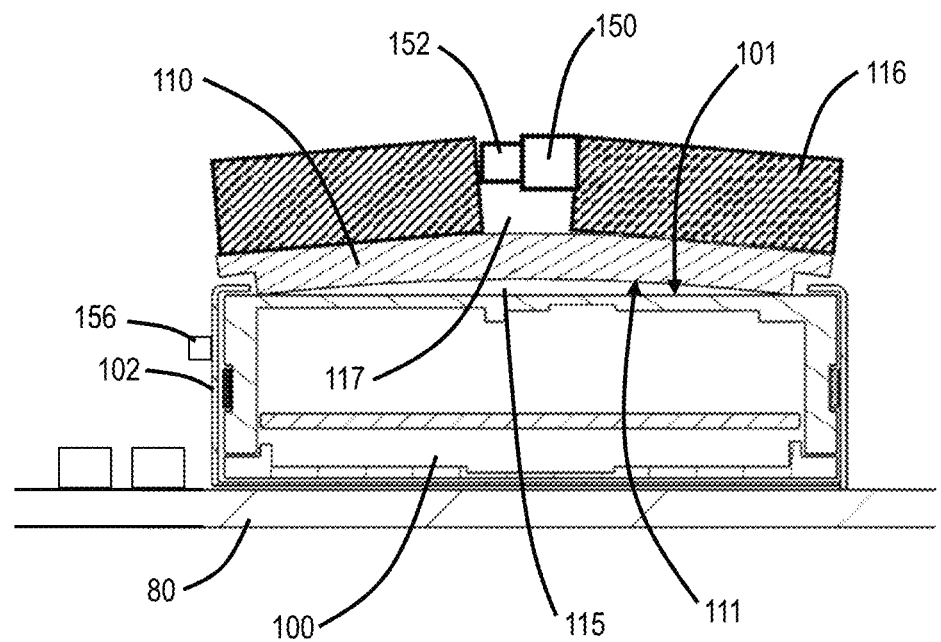
FIG. 25 is a cross-sectional diagram of the thermal control system and pluggable optical module inserted into a cage on a PCB of FIG. 24 with a bent heatsink.

In FIGS. 24 and 25 actuator 150 is positioned between protrusions, such as fins 116, extending from the heatsink 110. Actuator 150 includes a piston 152 that actuates to contact one or more protrusions, such as in an interference condition, and push the protrusions apart below the activation temperature and causes the contact area between the mating surface 111 and the module surface 101 to decrease and the average height of the air gap 115 between the mating surface 111 and the module surface 101 to increase. The actuation of actuator 150 may be initiated at the activation temperature to actuate the piston 152 into contact as the temperature decreases and to actuate the piston 152 out of contact with the protrusion as the temperature increases. A base 154 of the actuator 150 may remain in contact with one or more of the protrusions above and below the activation temperature.

Piston 152 may be passively or actively controlled. Actuator 150 may include wax that is contracted relative to the heatsink 110 at higher temperatures so as to cause the contact area between the mating surface 111 and the module surface 101 to decrease and the average height of the air gap 115 between the mating surface 111 and the module surface 101 to increase below the activation temperature. Actuator 150 may be controlled by controller 154 that uses sensor 156 to measure the temperature. Controller 154 causes the piston 152 to actuate at the activation temperature. When actuator 150 (140) is controlled by controller 154, actuator 150 (140) may require input power source 158 that is on the PCB 80.

Actuators 140 and 150 can be used in conjunction with actuator 130, such as to move wedges 131, 132, 133 with actuators 140 and 150, and can be used in conjunction with actuator 120 to bend the heatsink 110 and cause the contact area between the mating surface 111 and the module surface 101 to decrease and the average height of the air gap 115 between the mating surface 111 and the module surface 101 to increase below the activation temperature.

Figure 26:
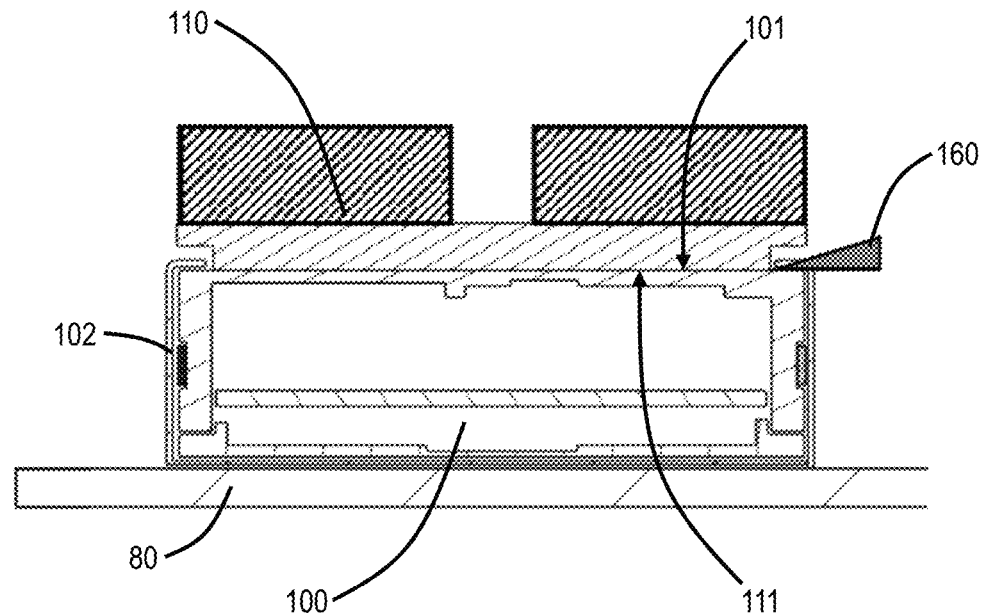
FIG. 26 is a cross-sectional diagram of a thermal control system and pluggable optical module inserted into a cage on a PCB.
Figure 27:
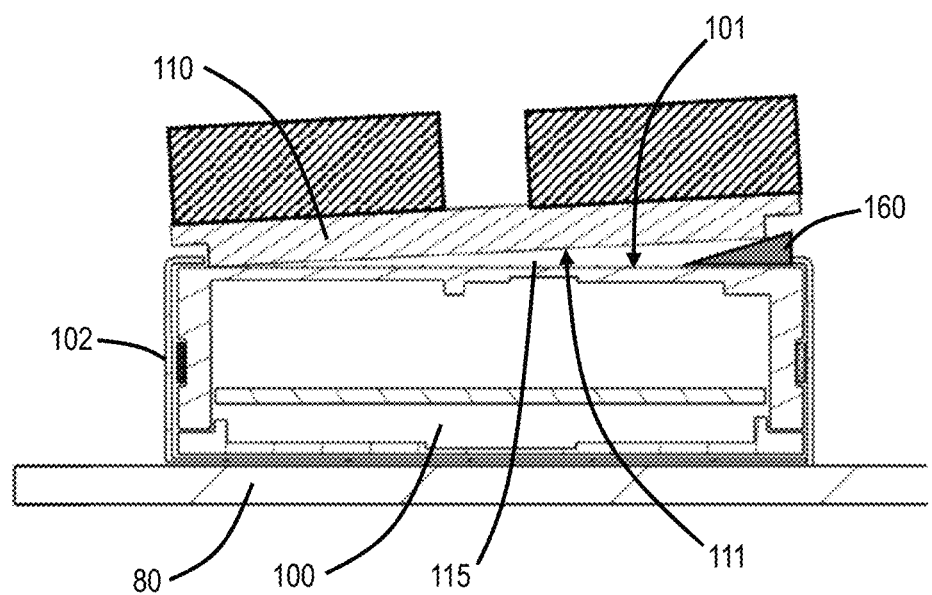
FIG. 27 is a cross-sectional diagram of the thermal control system and pluggable optical module inserted into a cage on a PCB of FIG. 26 with a lifted or tilted heatsink.

In FIGS. 26 and 27 actuator 160 acts against a spring clip force to raise a side of the heatsink 110 relative to the pluggable optical module 100 and create air gap 115. Actuator 160 can be a wedge positioned at an interface between the heatsink 110 and the pluggable optical module 100, such as the interface between mating surface 111 and module surface 101. Actuator 160 can include multiple wedges that can be used to move the heatsink 110 out-of-contact in a controlled manner, such as by raising the heatsink 110 relative to the pluggable optical module 100. Actuator 160 can be fastened to either a base of the heatsink 110 and act against the cage 102 or the PCB 80 or can be fastened to the PCB 80 and act against the heatsink 110. The actuator 160 can be active or passive and can be controlled similarly to actuators 120, 130, 140, 150 to cause the contact area between the mating surface 111 and the module surface 101 to decrease and the average height of the air gap 115 between the mating surface 111 and the module surface 101 to increase below the activation temperature.

Actuator 160 can be used in conjunction with actuators 120, 130, 140, 150 such as to be moved with actuators 140 and 150, and can be used in conjunction with actuator 120 to bend the heatsink 110 and cause the contact area between the mating surface 111 and the module surface 101 to decrease and the average height of the air gap 115 between the mating surface 111 and the module surface 101 to increase below the activation temperature.

Contact between any of the actuators 120, 130, 140, 150, 160 and the heatsink 110 may occur prior to the temperature reaching the activation temperature, but the contact area between the mating surface 111 and the module surface 101 may begin to decrease and the average height of the air gap 115 between the mating surface 111 and the module surface 101 may begin to increase once the temperature is at or below the activation temperature.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A thermal control system for pluggable optics in an optical platform, the thermal control system comprising:
a heatsink for dissipating heat from a pluggable optical module in the optical platform, the heatsink including a mating surface configured to make thermal contact with a module surface of the pluggable optical module inserted into the optical platform; and
an actuator configured to manipulate the mating surface to change a contact area between the mating surface and the module surface such that the contact area between the mating surface and the module surface is larger for a temperature above a predetermined temperature than for a temperature below a predetermined temperature.

2. The thermal control system of claim 1, wherein the actuator is configured to bend the heatsink such that at least a portion of the mating surface is separated from the module surface below the predetermined temperature to increase an average height of an air gap between the mating surface and the module surface.

3. The thermal control system of claim 1, wherein a coefficient of thermal expansion of the actuator is different than the coefficient of thermal expansion of the heatsink such that a change in contact between the actuator and the heatsink occurs resulting in bending of the heatsink.

4. The thermal control system of claim 1, wherein the actuator is positioned between protrusions extending from the heatsink, the actuator includes one or more wedges that shift to press outward on the protrusions when the temperature is below the predetermined temperature resulting in bending of the heatsink.

5. The thermal control system of claim 1, wherein the actuator is positioned between protrusions extending from the heatsink, the actuator includes a cam that rotates or a piston that extends to press outward on the protrusions when the temperature is below the predetermined temperature resulting in bending of the heatsink, and the actuator is passively or actively controlled.

6. The thermal control system of claim 1, wherein the actuator includes a combination of a rod or structure that has a coefficient of thermal expansion that is different than the coefficient of thermal expansion of the heatsink, one or more wedges, and a cam or a piston, that in combination cause bending of the heatsink below the predetermined temperature.

7. The thermal control system of claim 6, wherein the actuator is also configured to lift at least a side of the heatsink from the pluggable optical module when the temperature is below the predetermined temperature.

8. The thermal control system of claim 1, wherein the actuator is configured to lift at least a side of the heatsink from the pluggable optical module such that at least a portion of the mating surface is separated from the module surface below the predetermined temperature to increase an average height of an air gap between the mating surface and the module surface.

9. The thermal control system of claim 1, wherein the predetermined temperature is a minimum desired operating temperature of the pluggable optical module or a threshold temperature that is above a minimum operating temperature of the pluggable optical module.

10. The thermal control system of claim 1, wherein the pluggable optical module, the heatsink, and the actuator are configured to be enclosed in an optical platform enclosure that is hardened for outdoor or indoor mounting.

11. A method for thermally controlling a pluggable optical module in an optical platform, the method comprising:
    providing a heatsink for dissipating heat from a pluggable optical module in the optical platform, the heatsink including a mating surface configured to make thermal contact with a module surface of the pluggable optical module inserted into the optical platform;
    providing an actuator configured to manipulate the mating surface to change a contact area between the mating surface and the module surface; and
    passively or actively actuating the actuator such that the contact area between the mating surface and the module surface is larger for a temperature above a predetermined temperature than for a temperature below a predetermined temperature.

12. The method of claim 11, wherein passively or actively actuating the actuator includes bending the heatsink such that at least a portion of the mating surface is separated from the module surface below the predetermined temperature to increase an average height of an air gap between the mating surface and the module surface.

13. The method of claim 11, wherein a coefficient of thermal expansion of the actuator is different than the coefficient of thermal expansion of the heatsink, and actuating the actuator includes changing contact between the actuator and the heatsink due to the different coefficient of thermal expansions resulting in bending of the heatsink.

14. The method of claim 11, wherein the actuator is positioned between protrusions extending from the heatsink, and passively or actively actuating the actuator includes pressing outward on the protrusions when the temperature is below the predetermined temperature resulting in bending of the heatsink.

15. The method of claim 11, wherein passively or actively actuating the actuator includes lifting at least a side of the heatsink from the pluggable optical module when the temperature is below the predetermined temperature.

16. The method of claim 11, further comprising providing an enclosure that is hardened for outdoor or indoor mounting, wherein the pluggable optical module, the heatsink, and the actuator are configured to be enclosed in the enclosure.

17. An optical platform, comprising:
    a Printed Circuit Board (PCB) and associated components;
    a cage configured to receive a pluggable optical module, wherein the cage is mounted on the PCB;
    a heatsink for dissipating heat from the pluggable optical module, the heatsink including a mating surface configured to make thermal contact with a module surface of the pluggable optical module received into the cage;
    an actuator configured to manipulate the mating surface to change a contact area between the mating surface and the module surface such that the contact area between the mating surface and the module surface is larger for a temperature above a predetermined temperature than for a temperature below a predetermined temperature; and
    a housing enclosing the PCB, wherein the housing covers the PCB, the associated components, the cage with the pluggable optical module, the heatsink, and the actuator, with respect to airflow.

18. The optical platform of claim 17, wherein the actuator is configured to bend the heatsink such that at least a portion of the mating surface is separated from the module surface below the predetermined temperature to increase an average height of an air gap between the mating surface and the module surface, the actuator includes at least one of (1) a first actuator with a coefficient of thermal expansion of the actuator is different than the coefficient of thermal expansion of the heatsink such that a change in contact between the actuator and the heatsink occur resulting in bending of the heatsink, and (2) a second actuator positioned between protrusions extending from the heatsink, the actuator comprising one or more wedges that shift to press outward on the protrusions when the temperature is below the predetermined temperature resulting in bending of the heatsink.

19. The optical platform of claim 17, wherein the actuator is configured to lift at least a side of the heatsink from the pluggable optical module such that at least a portion of the mating surface is separated from the module surface below the predetermined temperature to increase an average height of an air gap between the mating surface and the module surface.

20. The optical platform of claim 17, wherein the housing includes an enclosure that is hardened for outdoor or indoor mounting.

* * * * *